United States Patent [19]

Kiley et al.

[11] 4,404,739

[45] Sep. 20, 1983

[54] METHOD FOR MOUNTING, ELECTRICALLY ISOLATING AND MAINTAINING CONSTANT PRESSURE ON A SEMICONDUCTOR ELEMENT

[75] Inventors: Richard F. Kiley, Stoneham; Ralph I. Larson, Jr., North Reading, both of Mass.

[73] Assignee: Thermal Associates, Inc., North Reading, Mass.

[21] Appl. No.: 351,174

[22] Filed: Feb. 22, 1982

Related U.S. Application Data

[63] Continuation-in-part of Ser. No. 142,862, Apr. 21, 1980, abandoned, and Ser. No. 171,827, Jul. 24, 1980, abandoned.

[51] Int. Cl.³ .................. H01L 21/52; H01L 21/58
[52] U.S. Cl. .................................. 29/588; 29/589; 357/79; 357/81
[58] Field of Search .............. 29/588, 589; 357/79, 357/81

[56] References Cited

U.S. PATENT DOCUMENTS

| | | | |
|---|---|---|---|
| 2,907,935 | 10/1959 | Nagorsen | 357/81 X |
| 3,943,623 | 3/1976 | Mizutani et al. | 29/589 X |
| 4,209,799 | 6/1980 | Schierz et al. | 357/81 |

Primary Examiner—L. Dewayne Rutledge
Assistant Examiner—Alan E. Schiavelli
Attorney, Agent, or Firm—Wolf, Greenfield, Sacks

[57] ABSTRACT

A semiconductor element is positioned between opposing faces of two thermally and electrically conductive members. An external force is then applied to the two members to move the opposing faces of the members toward each other and against the sides of the element. While this external force is maintained, the members are fixed in a housing by means of bonding means, and are separated from the housing by an electrically insulating, thermally conducting material, which may itself be the bonding means. Upon removal of the external force from the members, the members are held by the bonding means and the housing in thermal and electrical contact with the semiconductor element, and the assembly has been pre-stressed. During the operation of the semiconductor element the pressure is controlled by thermally responsive elements.

11 Claims, 8 Drawing Figures

METHOD FOR MOUNTING, ELECTRICALLY ISOLATING AND MAINTAINING CONSTANT PRESSURE ON A SEMICONDUCTOR ELEMENT

This application is a continuation in part of our co-pending applications Ser. No. 142,862, filed Apr. 21, 1980, now abandoned, and Ser. No. 171,827, filed July 24, 1980 now abandoned in favor of continuation application Ser. No. 411,299, filed on Aug. 25, 1982.

BACKGROUND OF THE INVENTION

This invention relates to a method of mounting a semiconductor element. More particularly, this invention relates to a mounting method which permits a semiconductor element to be used at higher power levels than previous power module designs permitted, by facilitating the increased cooling of said element, while at the same time providing electrical isolation of said element.

It is well known that the proper utilization of a semiconductor element requires an awareness that heat developed by power dissipation at the junction of the semiconductor must be carefully considered. This heat generation problem becomes particularly important in semiconductor applications involving one ampere of current or more—so-called "power semiconductor" applications. Short-term or long-term temperature excursions not only impair the electrical characteristics of a semiconductor device, but also set up internal mechanical stresses at each of the semiconductor material interfaces. In order to obtain maximum efficiency and greater reliability in the use of a semiconductor, heat developed by power dissipation at the junction must be removed as rapidly as possible. Power semiconductors are normally mounted in a package for purposes of protection of the delicate semiconductor structure; this package is then itself often mounted on a heat sink to facilitate cooling of the semiconductor elements. Thus, heat generated in the semiconductor elements travels from the element to the package, then to the heat sink, and then to the ambient (e.g., natural convection air, forced air, oil, water, etc.). By increasing the thermal conductance at any point along this heat transfer path, one can improve the heat transfer from, and thus the cooling of, the semiconductor element. See Westinghouse Power Semiconductor User's Manual and Data Book (January 1978), p. 42.

Power semiconductors were first offered only in stud-mount assemblies, which provided only one-side cooling of the semiconductor element. Moreover, these assemblies were limited to relatively small devices due to problems occurring in the solder used to bond the semiconductor element to the device package.

Subsequently, packaging of the usually wafer-shaped semiconductor element in a disc construction avoided the solder problem, and provided increased thermal conductance by permitting cooling of both sides of the element. Good thermal contact between the element and the encompassing disc is achieved by applying and maintaining force approximately in the range of 500 to 10,000 pounds on the parallel sides of the disc, which are thus pressed into intimate contact with the parallel sides of the semiconductor wafer. In addition, these discs devices can be readily arranged in series or back-to-back, or may be inverted to reverse polarity. However, prior art disc packages require special clamps and/or springs to produce and maintain the required pressure on the sides of the disc, resulting in a complete assembly that is relatively bulky, complicated, and expensive. Although these disc packages permit double-side cooling of the semiconductor element, they present the further serious drawback that the power connections to the semiconductor device are not electrically isolated from the heat sinks.

Therefore, it is an object of the present invention to provide a method for mounting a semiconductor element that will increase the power-handling capability of said element by providing double-side cooling thereof.

It is another object of this invention to provide such a method that will, at the same time, eliminate the need for bulky and complicated springs or clamps to maintain pressure on the semiconductor/package interface.

It is still another object of this invention to provide such a method that will also permit mounting of semiconductor element in electrical isolation from a heat sink to which it may be attached.

Still another object of this invention is to provide such a method that will enable maintenance of the requisite pressure on the semiconductor element over its entire operating temperature range.

It is a further object of this invention to provide such a method that will enable use of a single heat sink, while providing isolated, double-side cooling of the semiconductor element.

Objects and advantages of the present invention are set forth in part above and in part below. In addition, these and other objects and advantages of the invention will become apparent herefrom or may be appreciated by practice with the invention, the same being realized and attained by the instrumentalities, combinations, and methodologies pointed out in the appended claims. Accordingly, the invention resides in the novel parts, arrangements, combinations, steps, methods, and improvements herein shown and described.

SUMMARY OF THE INVENTION

Briefly described, in the method of the present invention, the semiconductor element is positioned between opposing faces of two thermally and electrically conductive blocks or members. An external force is then applied to the two members to move the opposing faces of the members toward each other and against the opposite sides of the element. While this external force is maintained, the members are fixed in a housing or retaining frame by means of bonding means, and are separated from the housing by an electrically insulating, thermally conducting material, which may itself be the bonding means. Upon removal of the external force from the members, the members are held by the bonding means in cooperation with the housing in thermal and electrical contact with the semiconductor element and the assembly has been pre-stressed.

In the preferred method of the present invention, the members or blocks are fixed in a housing which is adapted for attachment to a heat sink. In one embodiment of the present invention, prior to placing the members into the housing, a layer of bonding material, preferably heat curable, is interposed between the housing and the members. The bonding material is so chosen as to permit passage of heat from each side of the semiconductor element through the respective member, to the housing, and thence to any attached heat sink, while at the same time serving to electrically insulate the semiconductor element from the housing. After the members are placed in the housing, additional bonding material may be applied to the surfaces of the members which are exposed. Electrically-insulating filler material may be added as appropriate to fill any empty spaces between the parts of the assembly, and to provide a dust-free cover over the members. In the preferred embodiment, the assembly is then heated to a temperature sufficient to cause the bonding material to cure near or at the maximum operating temperature of the semiconductor in order to form an integral bond between the members and the housing. After the assembly has cooled, the external clamping force is removed. The bonding material, loaded primarily in shear, serves to hold the members in place within the housing and pressed against the semiconductor element to maintain the pressure on the semiconductor element. As further explained below, the assembly has thus been pre-stressed, and will maintain the required pressure indefinitely.

The resulting semiconductor mounting assembly may be readily mounted on a single heat sink, to provide double-side cooling of the semiconductor element while maintaining the semiconductor element in electrical isolation from the heat sink, without the need for bulky clamps or springs.

It will be understood that the foregoing general description as well as the following detailed description are explanatory of the invention and are not intended to be restrictive thereof. Accordingly, the accompanying drawings, referred to herein and forming a part hereof, illustrate a preferred embodiment of the invention and, together with the description, serve to explain the principles of the invention.

DETAILED DESCRIPTION OF THE INVENTION

Figure 1:
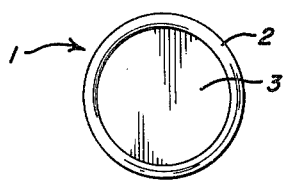
FIGS. 1 and 1B depict two typical wafer-shaped semi-conductor elements, namely a diode and a center gate thyristor, respectively.
Figure 1A:
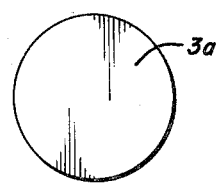
FIG. 1A depicts the reverse side of said wafers, which is substantially plain in configuration.
Figure 1B:
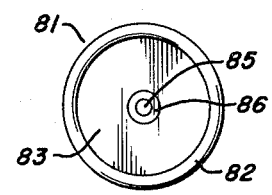

The method of the present invention can be readily understood with reference to the accompanying drawings. Two typical semiconductor elements used in power semiconductor applications are shown in FIGS. 1, 1A and 1B. FIG. 1 depicts a wafer-shaped diode 1, such as available from Westinghouse Electric Co., and included as the active element of Westinghouse package No. R620, which is approximately 3/32 inch thick and one inch in diameter. A narrow ring of protective material 2 deposited or placed at the outer rim of the cathode side of the wafer protects the edge of the semiconductor. The reverse side of the wafer, anode 4 (FIG. 1A), is essentially plain in configuration. FIG. 1B depicts a wafer-shaped center gate thyristor 81, such as that included as the active element in Westcode package N195CH10, having protective ring 82, cathode 83, pilot thyristor 86 and gate 85. The anode side of this wafer is essentially plain in configuration, as shown in FIG. 1A.

It is to be understood, however, that application of the method of the present invention is not limited to diodes and center gate thyristors, or even to wafer-shaped devices. It is equally applicable to a wide range of other semiconductor devices capable of being pressure-mounted, including transistors, semiconductor arrays, triacs, varistors, etc.

Figure 2:
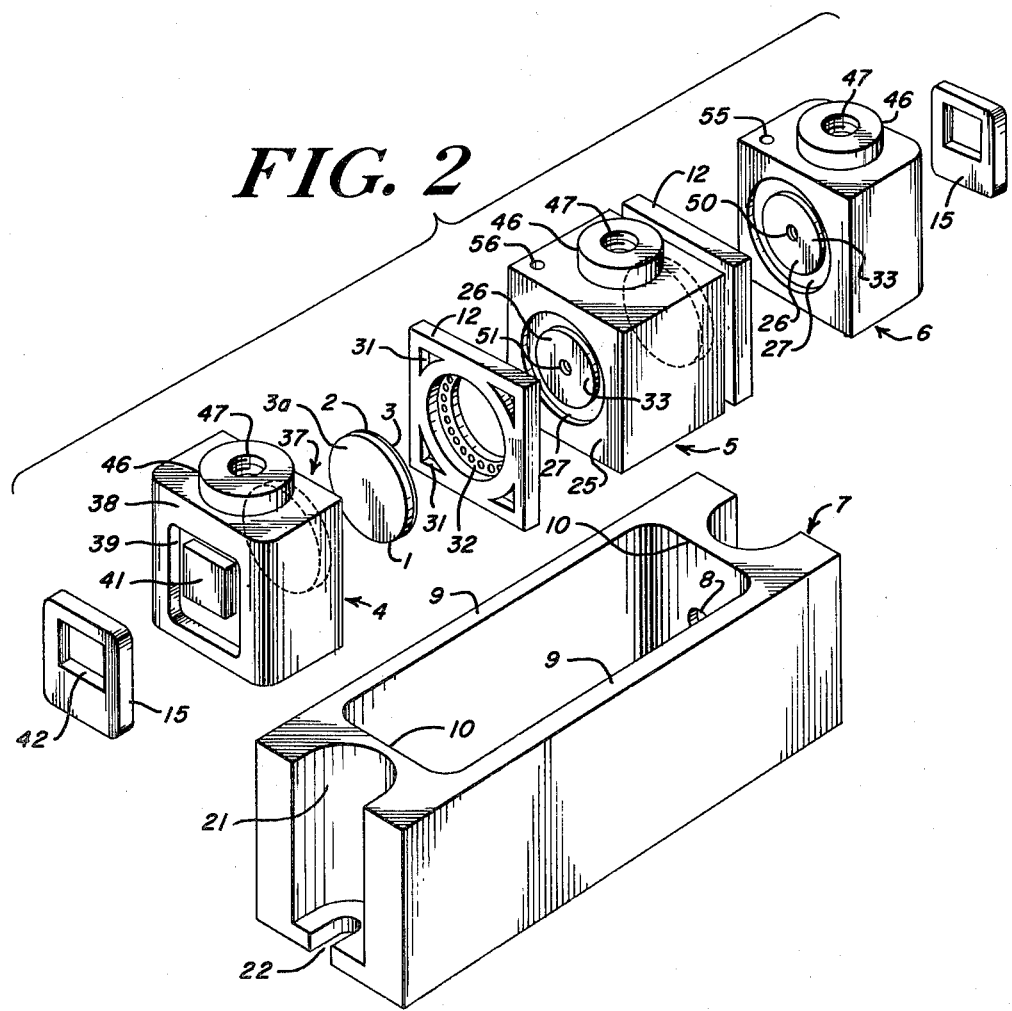
FIG. 2 is an exploded view illustrating a semiconductor assembly mounted by the method of the present invention.
Figure 3:
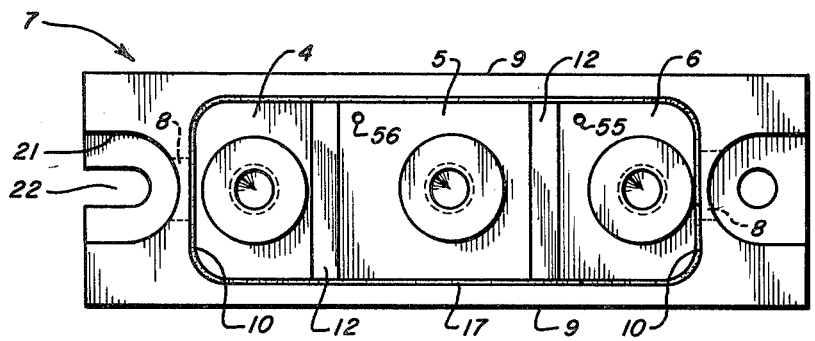
FIG. 3 is a top plan view of the semiconductor assembly of FIG. 2.

Referring to FIGS. 2 and 3, the method of the present invention is illustrated for supporting a pair of semiconductor devices such as the diode of FIG. 1, or the thyristor of FIG. 1B, in linear array. Although FIGS. 2 and 3 illustrate the support of two devices in a single assembly, it should be understood that the same method may be adapted to support one, or more than two devices, in a similar array.

In FIG. 2, wafer-shaped diodes 1 are positioned between pairs of electrically conductive members or blocks 4 and 5 and 5 and 6. Block 5 comprises an intermediate member while blocks 4 and 6 comprise end members. As illustrated in FIG. 3, blocks 4, 5, and 6 are secured within retaining means comprising a rigid frame 7 having side walls 9 and integrally formed end walls 10.

Gaskets 12 are secured between the blocks 4 and 5 and blocks 5 and 6. In addition, thermally responsive elements 15 (FIG. 2) are positioned between the outermost ends of the linear array of blocks and the end walls 10 of the rigid frame 7. As further explained below, this assembly is appropriately bonded under compression by an epoxy bonding material positioned between the blocks and the interior surfaces of retaining frame 7, as illustrated at 17 (FIG. 3).

Figure 4:
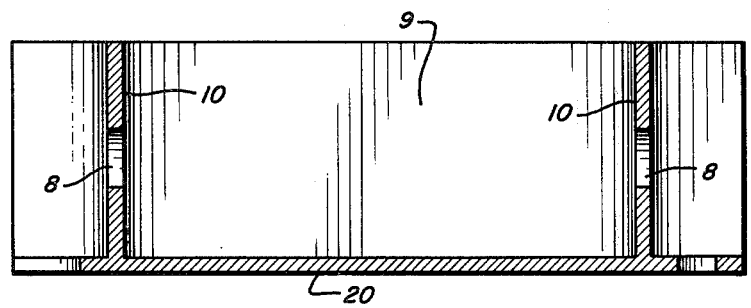
FIG. 4 is a longitudinal cross-sectional view of the retaining frame of the assembly of FIG. 2.

FIGS. 2 and 4 illustrate the constructional details of the compression means. As illustrated, this compression means includes the retaining means formed by the side walls 9 and end walls 10 of retaining frame 7. These walls are integrally formed with bottom wall 20 (FIG. 4). The ends of the retaining means 7 are provided with appropriate recesses 21 and mounting holes 22 to permit the assembly to be suitably mounted by screws or the like. The retaining frame 7 is preferably of a "bathtub" shape, made of aluminum or other suitable thermally conductive material, and should be made with walls sufficiently massive to maintain the compressive forces applied to the assembly. It should be recognized, however, that retaining frame 7 could take on a variety of configurations, such as one having a bottom and two end walls, or having only one side wall connected to two end walls. However configured, the frame must provide a holding force in the axial direction to maintain the assembly encompassing the semiconductor element under compression within frame 7.

Blocks 4, 5, and 6 are also preferably formed of electrically and thermally conductive material such as aluminum. Block 5 forming the intermediate member has generally a cube shape. One surface of this cube is formed with a cylindrical depression 26 (FIG. 2) with an annular channel or groove 27 at the periphery of the bottom of this shallow cylindrical depression 26. The depression 26 and the channel 27 are shaped and sized to receive in snug engagement an assembly of the semiconductor device 1 and gasket 12. An identical depression 26 and channel 27 are included on block 6.

The gasket 12 comprises a highly flexible and conforming dielectric multicomponent filled material such as silicone rubber. The function of this gasket is to provide a mechanical seal about the periphery of the semiconductor element 1 when the element is pressure-mounted within the assembly. Since the coefficient of expansion of this gasket 12 is higher than the coefficient of expansion of either the semiconductor material or the block by a significant factor of 10, provisions are made in the gasket to accommodate the differential rates of expansion of the gasket relative to the adjacent semiconductor device and block. To achieve this accommodation, the gasket 12 is formed with a plurality of openings or holes 31 and 32. Holes 31 extend from one face to the other face of the gasket in that portion which is compressed between adjacent surfaces of the blocks. Holes 32 of the gasket 12 are formed in an annular array interposed between the semiconductor device 1 and the adjacent block. These holes 31 and 32 are designed to permit volumetric expansion in a direction normal to the linear array of blocks and semiconductors, thereby minimizing the effect of differential expansion by the gasket on adjacent components. The differential expansion will thus cause the gasket to move perpendicularly to the compressive forces.

Figure 6:
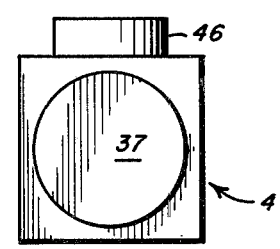
FIG. 6 is a plan view of the face of block 4 of FIG. 2 that contacts the semiconductor wafer.

The assembly of the semiconductor device 1 and gasket 12 is positioned within the cylindrical opening at 26 in Block 5 with the surface 3 in thermal and electrical contact with the projecting boss 33 formed in block 5 at the bottom of the cylindrical depression 26, adjacent annular groove 27. The anode terminal 3a (FIG. 1A) of the semiconductor device 1 is thermally and electrically engaged by a cylindrical projection (FIG. 6) extending from the adjacent surface 37 of block 4. This projection has a diameter preferably equal to the diameter of terminal 3a. The boss 37 is integrally formed with the block 4. The opposite surface 38 of block 4 is formed with a rectangular channel 39. This channel 39 is shaped to receive in close fitting contact the thermally responsive element 15. The thermally responsive element 15, however, projects outwardly from the wall 38, a distance in the order of a tenth of an inch or more. A boss 41 integrally formed in the block 4 fits within a corresponding opening 42 in the element 15, providing alignment. Thermally responsive elements 15 are manufactured from a material whose thermal coefficient of expansion is greater than that of the blocks or the retaining frame. A suitable material for said thermally responsive elements is silicone rubber. As temperature increases, thermally responsive elements 15 will expand, increasing compression forces on the assembly within frame 7.

An assembly of a semiconductor and gasket similar to the semiconductor 1 and gasket 12 previously described, is positioned between block 5 and the block 6. Block 6 is shaped similarly to and is a mirror image of the block 4 except for a connective opening hereafter described. Each block is formed with an integrally formed protrusion 46 having a threaded opening 47 adapted to provide external bus bar connections.

Figure 5:
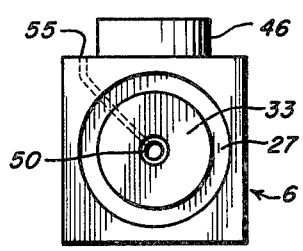
FIG. 5 is a plan view of the face of block 6 of FIG. 2 that contacts the semiconductor wafer.

For purposes of mounting the center gate thyristor 81 of FIG. 1B, blocks 5 and 6 are provided with openings or channels 51 and 50, and passageways 56 and 55, respectively, to provide access for electrical contact to gate 85 of the device, to isolate the gate contact from the cathode, and to seal and protect the gate contact from outside contaminant gases or moisture. As best seen in FIG. 5, a connecting wire may be passed through passageway 55 and through opening 50 to gate 85. Similarly for block 5, a connecting wire may be passed through passageway 56 at opening 51 in block 5 to the gate of the other mounted thyristor. Thus when mounted in the assembly of FIG. 2, the anode, cathode and gate of each thyristor are connected to respective electrical terminals.

The assembly comprising the blocks 4, 5 and 6 with the gasket 12 and semiconductor devices 1 intermediate the blocks are positioned within the retaining frame 7 under linear compression. An external compression force of in the range of 500 to 10,000 psi is applied to the outermost ends of the linear assembly of blocks 4, 5 and 6, gasket 12, semiconductor devices 1 and thermally responsive elements 15.

This force is applied by means of clamps, springs or the like, so as to move blocks 4 and 5 and blocks 5 and 6 into intimate contact with the respective device 1 intermediate said pairs of blocks, thereby effecting good thermal contact between the block faces and the respective parallel sides of device 1. Preferably, this force is applied after the block-gasket-semiconductor array is positioned within retaining frame 7, by means of clamps or springs contacting end blocks 4 and 6 through holes 8 in each end wall 10 of retaining frame 7. The retaining means is dimensioned to receive in very tight fit this assembly at ambient temperatures. While the external force is being maintained, the linear array is secured within the retaining means 7 by a layer of electrically insulating bonding material which coats the walls 9 and 10 and bottom 20 of the retaining means. The bonding material may be applied initially in liquid or paste form or may be included in the form of epoxy pre-forms or glass sheets. This electrically insulating material insulates the blocks from the retaining means while still permitting flow of heat from the semiconductor element through the blocks and retaining means. A suitable bonding material is available under the trademark Thermal Bond, a heat curable, filled epoxy system marketed by Thermal Associates, Inc. of North Reading, Mass. This particular material is curable over a wide range of temperatures, depending upon the cure cycle and catalyst used. The thickness of the bonding material layer is preferably 0.01 inch but may be thicker or thinner, depending upon the electrical insulating characteristics and the thermal conduction characteristics desired.

In the preferred method of the invention, retaining frame 7 is precoated with a layer or layers of the bonding material and cured, so that the dielectric strength can be tested for the desired voltage level. A further layer is then added before the block-gasket-semiconductor assembly is introduced into the retaining frame or housing. Alternatively, blocks 4, 5 and 6 could be partially coated with the bonding material and cured prior to assembly. The block-gasket-semiconductor assembly is placed within retaining frame 7, and is separated from the surface of the frame by the layer of bonding material. The final assembly operation should preferably be accomplished in a nitrogen atmosphere under dry box conditions. An electrically-insulating filler material such as silicone rubber or epoxy (e.g., General Electric RTV627A and RTV627B in a 50/50 mix) may be applied in the vacant space in the voids adjacent the exposed surfaces of the assembly. This housing block assembly is then heated to a temperature sufficient to cause the bonding material to form an integral bond between the sides and bottoms of blocks 4, 5 and 6 and frame 7, and preferably to a temperature at or near the maximum operating temperature of the semiconductor element, as will be further explained below. It has been determined that the assembly should be cured rapidly, or else the epoxy will cure at too low a temperature, resulting in insufficient axial force on the wafer.

As indicated, the curing temperature is preferably chosen to be at or near the operating temperature of the semiconductor device, so that adequate force will be maintained on the semiconductor when in operation. For example, the center gate thyristor assembly described above operates at a maximum junction temperature of 125 degrees C. Therefore, the bonding material is preferably cured at 125 degrees C., and for at least 15 minutes. It is advisable, however, to allow the assembly to cure for as much as one hour or more to ensure a good set.

After this assembly has cooled, the axial external force is removed from blocks 4 and 6. Removal of said external force transfers the load to frame 7, which then becomes loaded primarily in tension, and to the bonding material, loaded primarily in shear. The bonding material cooperates with frame 7 to maintain the desired axial force on blocks 4, 5 and 6 to maintain the good thermal contact required between the blocks and semiconductor elements 1 to ensure sufficient two-sided cooling of the elements 1. Blocks 4, 5 and 6 are primarily loaded in compression and secondarily may be in beam bending. Here, the bonding material also serves to conduct heat from semiconductor elements 1 through blocks 4, 5 and 6 to frame 7, while at the same time electrically insulating said frame from the semiconductor elements and blocks 4, 5 and 6. Frame 7 may be affixed to a heat sink, as desired, via mounting holes 22. In some applications, however, frame 7 may serve as its own heat sink.

By curing the assembly at or near the operating temperature of the semiconductor, while maintaining the required axial force on the semiconductor by means of external springs or clamps, the assembly will retain a desirable locked-in stress pattern so that the assembly is pre-stressed when the clamps are removed. This occurs for two reasons. First, when the external clamps or springs are applied to the blocks-gasket-semiconductor assembly, the blocks are deformed or strained in accordance with the modulus of elasticity of the material of which they are comprised. After affixation to the frame by the cured bonding means, removal of the clamps or springs will result in a rearrangement of the strain deflections such that an axial force is maintained on the semiconductor element. Thus, the assembly is pre-stressed at the curing temperature. This effect provides an offset stress so that the required axial force is maintained on the semiconductor even at its operating temperature.

Secondly, the metal blocks or members are fabricated from materials having higher thermal expansion co-efficients than the semiconductor element. Therefore, if during the curing cycle, a force in the 500–10,000 pound range required for good thermal contact is maintained on the blocks, when the assembly cools, the axial force on the semiconductor element will actually increase, due to the relatively greater contraction of the blocks and frame as compared to the semiconductor element. After the external springs or clamps are removed, if the assembly is again heated (for example by heat generated during operation of the semiconductor element), the axial force will decrease as the blocks and housing expand. However, by initially curing the assembly at or near the operating temperature of the semiconductor element, the assembly will have been pre-stressed, so that the axial force will never fall below the required 500–10,000 pound range during operation of the semiconductor element.

The method of the present invention may be advantageously utilized in numerous applications, including applications in which it is desired that a given semiconductor element handle more power than previous power module designs permitted, that a given semiconductor element operate at lower temperature at a particular power level, or that smaller semiconductor element be used at a given temperature and power level. The present invention thus achieves improvement in reliability and/or reduction in cost or size over prior art methods.

It will be readily appreciated by those skilled in the art that the present invention in its broader aspects is not limited to the specific embodiments herein shown and described. For example, the blocks may be fixed to the frame by a variety of means other than the heat curable epoxy resin employed in the preferred embodiment. The blocks could be secured to the housing or frame by insulated rivets, while being electrically insulated from the frame by some other thermally conductive means. Or a non-heat curable bonding material might be used, such as a pressure-curable cyano-acrylate (e.g., Eastman 910). Or the blocks might be heat fused to the frame using, for example, a solder glass frit. These various approaches may be employed in accordance with the present invention, as long as they provide the required axial force on the semiconductor element over the range of operating temperatures of that element.

Accordingly, variations may be made from the embodiments described herein which are within the scope of the accompanying claims, without departing from the principles of the invention and without sacrificing its chief advantages.

What is claimed is:

1. A method for mounting a semiconductor element having opposing sides in a retaining frame to facilitate electrical connection and double-side cooling of said element, comprising:

positioning said element between two electrically and thermally conductive members;

applying to said members external force to maintain said members in electrical and thermal contact with the opposing sides of said element;

fixing said members in said retaining frame by means of bonding means, said members being electrically isolated from said retaining frame by thermally conductive insulation means;

removing said external force from said members, so that said members are maintained in electrical and thermal contact with said semiconductor element by said bonding means to cooperation with said retaining frame.

2. The method of claim 1, wherein said bonding means and insulation means comprise the same materials.

3. The method of claim 2 wherein said material is a heat curable resin, and said members are fixed in said housing by curing said resin.

4. The method of claim 3 wherein said resin is cured at about the operating temperature of the semiconductor element.

5. The method of claim 3 wherein said resin is an epoxy resin.

6. The method of claim 4 wherein said resin is an epoxy resin.

7. The method of claim 1 wherein, subsequent to removal of the external force, said retaining frame is primarily loaded in tension and said bonding means is primarily loaded in shear.

8. The method of claim 2 wherein, subsequent to removal of the external force, said housing is primarily loaded in tension and said bonding means is primarily loaded in shear.

9. The method of claim 1 wherein said external force is perpendicular to the sides of said element.

10. The method of claim 1, wherein said members are fixed in said retaining frame along with thermally responsive means, which means has a coefficient of thermal expansion greater than that of said members, for increasing the compression force on said semiconductor element as the temperature thereof increases.

11. The method of claim 1, wherein said semiconductor element is protected, located and supported by a pressure-loaded gasket.

* * * * *

UNITED STATES PATENT AND TRADEMARK OFFICE
CERTIFICATE OF CORRECTION

PATENT NO. : 4,404,739
DATED : September 20, 1983
INVENTOR(S) : Richard F. Kiley et al.

It is certified that error appears in the above-identified patent and that said Letters Patent is hereby corrected as shown below:

Column 8, claim 1, line 53, "to" should read -- in --.

Signed and Sealed this

Seventeenth Day of January 1984

[SEAL]

Attest:

GERALD J. MOSSINGHOFF

Attesting Officer

Commissioner of Patents and Trademarks